United States Patent [19]

Taraci

[11] Patent Number: 5,798,652
[45] Date of Patent: Aug. 25, 1998

[54] METHOD OF BATCH TESTING SURFACE MOUNT DEVICES USING A SUBSTRATE EDGE CONNECTOR

[75] Inventor: Brian Taraci, Foothill Ranch, Calif.

[73] Assignee: Semicoa Semiconductors, Costa Mesa, Calif.

[21] Appl. No.: 688,234

[22] Filed: Jul. 29, 1996

Related U.S. Application Data

[63] Continuation of Ser. No. 413,924, Mar. 29, 1995, abandoned, which is a continuation of Ser. No. 157,990, Nov. 23, 1993, abandoned.

[51] Int. Cl.[6] .................................................. G01R 31/02
[52] U.S. Cl. .......................... 324/754; 324/763; 324/765; 437/8; 437/207
[58] Field of Search ..................... 357/72, 74; 257/723; 361/398; 324/754, 158.1, 755, 763, 765; 437/8, 205–220

[56] References Cited

U.S. PATENT DOCUMENTS

| | | | |
|---|---|---|---|
| 3,839,781 | 10/1974 | Russell | 437/8 |
| 4,329,642 | 5/1982 | Luthi | 324/158 F |
| 4,426,773 | 1/1984 | Hargis | 29/832 |
| 4,677,528 | 6/1987 | Miniet | 361/398 |
| 4,682,207 | 7/1987 | Akasaki | 357/74 |
| 4,764,723 | 8/1988 | Strid | 324/158 P |
| 4,926,117 | 5/1990 | Nevill | 324/158 F |
| 4,992,850 | 2/1991 | Corbett | 357/72 |
| 5,175,491 | 12/1992 | Ewers | 324/755 |
| 5,280,193 | 1/1994 | Lin | 257/723 |
| 5,315,241 | 5/1994 | Ewers | 324/158.1 |
| 5,491,111 | 2/1996 | Tai | 437/209 |

*Primary Examiner*—Vinh P. Nguyen
*Assistant Examiner*—Russel M. Kobert
*Attorney, Agent, or Firm*—Blakely, Sokoloff, Taylor & Zafman LLP

[57] ABSTRACT

The present invention is used with single devices mounted on a ceramic substrate. The devices are broken out of the sheet, after all testing, electrical conditioning, and screening, as small surface mount devices. Conductive strips are formed on the ceramic substrate and are spaced to match a standard circuit board edge connector. These strips are electrically connected to the devices to allow testing and burn-in in sheet form rather than testing each device individually. The design reduces handling of the individual devices. The invention allows all of the testing and assembly to be done in a "batch" fashion. The board that is used to test the devices is separated to create the package for the individual components. The technique of the invention reduces cost and handling damage.

18 Claims, 3 Drawing Sheets

METHOD OF BATCH TESTING SURFACE MOUNT DEVICES USING A SUBSTRATE EDGE CONNECTOR

This is a continuation of a U.S. patent application (Application No. 08/413,924) filed Mar. 29, 1995, now abandoned, which is a continuation of a U.S. Patent application (Application No. 08/157,990) filed Nov. 23, 1993, now abandoned.

BACKGROUND OF THE INVENTION

1. Field of the Invention

This invention is directed to batch testing of semiconductor devices.

2. Background Art

As part of the manufacture of semiconductor devices, it is desired to test the devices so that inoperative devices can be identified and disposed of. Testing can occur at many times during the process of manufacture. For example, semiconductor devices are sometimes manufactured in bulk as a plurality of die on a substrate (referred to as a "wafer"). A "grid" of devices on the wafer are created, and each die is coupled to a test circuit using probes. Inoperative or substandard die are identified by results of the testing process and are marked as "bad" or "rejected". After this initial testing, the die are individually broken off the wafer and are "packaged" in a form for distribution. At this time, the packaged devices are individually tested again so that only operative devices are delivered. This individual testing of packaged devices is time consuming. It is desired to provide a system for simultaneous testing of multiple packaged devices.

A number of prior art patents describe semiconductor device testing schemes.

U.S. Pat. No. 3,568,129 to Gold is directed to a circuit board to which a plurality of integrated circuits can be attached. At least some of the sockets for the integrated circuits are removable so that they can be interchanged with different types of sockets to accommodate a variety of integrated circuit packages. Gold does not teach the use of edge connectors created on a substrate sheet to enable the batch testing of surface mount devices using substrate sheets. The testing board is not part of the finished device.

Rattcliff et al., U.S. Pat. 3,860,313, describes a circuit board with a plurality of electrical component receiving locations for packaged integrated circuits. The board includes a plurality of parallel recesses arranged in parallel to be used for connecting discrete electrical circuit components. Rattcliff et al. provides for the use of a clamping ring for creating a tight connection of the electric circuit component leads against the conductive material in the recesses. Rattcliff et al. does not teach the use of edge connectors created on a substrate sheet to enable the batch testing of surface mount devices using substrate sheets.

Hargis, U.S. Pat. No. 4,426,773, describes an array of electronic packaging substrates with each one having a plurality of electrically interconnected internal and external terminals. The array has a matrix structure of lines of separation and conductors to allow for the attachment of electronic components to the electronic packaging substrates. This configuration allows for testing of the components in an array format.

The array's connection points to external circuitry, labeled 13A, B, C, D in FIG. 4 are not of the edge connector type, rather they are contact pads. The external connection pads are of the type that contact point connection, perhaps using a probe similar to a wafer sort probe, rather than an edge connector type external connection. The arrays matrix does not allow for individual testing without first breaking the substrate into individual sections, at which time it cannot be put back together for further stress testing.

U.S. Pat. No. 4,689,103 to Elarde is directed to a method of processing an array of injection molded plastic substrates to form electronic circuits. Elarde provides that the plastic substrates are injection molded separately and then physically connected to a common planar array using a carrier board with receptacles. Each of the substrates having metal deposited in its pattern of channels. Electronic circuits may then be formed on each of the substrates in the planar array by stuffing the array with electronic components using an automatic insertion machine. Elarde does not teach the use of edge connectors created on a substrate sheet to enable the batch testing of surface mount devices using substrate sheets.

U.S. Pat. No. 4,870,356 to Tingley is directed to a universal test fixture for electrically connecting a plurality of component pins to compute test logic without the need for specialized sockets. The test fixture comprises a planar dielectric substrate having a multi-conductor pattern on the top surface comprising a plurality of equal width, equal spaced conductor bars, and including electrical conductors for connecting the spaced conductor bars to test logic. A resiliently deformable member or material enables the fixture to compensate for varying planarity between the tips of the component pins to be tested. Tingley does not teach the use of edge connectors created on a substrate sheet to enable the batch testing of surface mount devices using substrate sheets.

Eichelberger et al., U.S. Pat. No. 4,937,203, is directed to a removable polymer film with a metallization layer that is used to test a plurality of unpackaged interconnected integrated circuit devices mounted on a substrate. The metallization layer on the film is used to connect the circuits with a minimum of capacitive loading. A plurality of films may be used to allow the circuit to be tested in a plurality of configurations. Eichelberger et al. provides a test integrated circuit device disposed on the substrate to drive at least some of the plurality of devices. Eichelberger et al. does not teach the use of edge connectors created on a substrate sheet to enable the batch testing of surface mount devices using substrate sheets.

U.S. Pat. No. 4,926,117 to Nevill is directed to a two-piece burn-in board which has an ability to act as a standard burn-in board, in which all devices on the board share common signals. The board can be disassembled so that it has the ability to act as a device carrier wherein each individual device is completely isolated and has a standard burn-in board wherein all devices share the common signals. Nevill is directed to use with packaged integrated circuit devices, and for this reason among others Nevill does not teach the use of edge connectors created on a substrate sheet to enable the batch testing of surface mount devices using substrate sheets.

U.S. Pat. No. 4,968,931 to Littlebury et al. describes a method of burning in integrated circuits on a semiconductor wafer using a flexible membrane probe enclosed in a chamber. The flexible membrane probe is sized so that it can couple to a plurality of points on the wafer and is connected to external circuitry to drive the integrated circuits on the wafer in parallel. A bladder, which lies behind the membrane probe is inflated to cause the probe to couple to each of the contact pads on the wafer. Littlebury et al. uses a flexible membrane to couple to a semiconductor wafer, and for this reason among others it does not teach the use of edge connectors created on a substrate sheet to enable the batch testing of surface mount devices using substrate sheets.

Chang, U.S. Pat. No. 5,031,073, is directed to a method and apparatus for fault isolation on a circuit board. The method use a printed circuit board that is partitioned into a plurality of circuit regions which are selectively isolated with respect to input and output signals. The fault in the circuit is then identified using provided techniques for connecting and isolating the partitioned circuits. Chang describes the use of a circuit board with attached packaged integrated circuits and which is designed to allow for easy of isolation and reconnection of each partition, for these reasons among others Chang does not teach the use of edge connectors created on a substrate sheet to enable the batch testing of surface mount devices using substrate sheets.

Ewers, U.S. Pat. No. 5,175,491, describes a test fixture for simultaneously performing burn in and testing of multiple packaged integrated circuit devices. The packaged integrated circuits rest on electrical contacts without sockets. A top plate and a compressible material are used to accommodate variations in package size and still provide for contact to the leads. Ewers is directed to the testing of packaged devices in an external carrier mechanism, and for this reason among others Ewers does not teach the use of edge connectors created on a substrate sheet to enable the batch testing of surface mount devices using substrate sheets.

U.S. Pat. No. 5,180,974 to Mitchell et al. is directed to an integrated system for testing, marking, inspecting, and shipping completed semiconductor integrated circuit parts in a modified standard shipping tray by the combined use of a novel tray cover and an appropriately designed burn-in board assembly. The burn-in board is designed for packaged integrated circuit packages, and for this reason among others does not teach the use of edge connectors created on a substrate sheet to enable the batch testing of surface mount devices using substrate sheets.

SUMMARY OF THE PRESENT INVENTION

The present invention is used with single devices mounted on a ceramic substrate. The devices are broken out of the sheet, after all testing, electrical conditioning, and screening, as small surface mount devices. Conductive strips are formed on the ceramic substrate and are spaced to match a standard circuit board edge connector. These conductive strips are electrically connected to the devices to allow testing and burn-in in sheet form rather than testing each device individually.

The design reduces handling of the individual devices. The invention allows all of the testing and assembly to be done in a "batch" fashion. The board that is used to test the devices is separated to create the package for the individual components. The technique of the invention reduces cost and handling damage.

BRIEF DESCRIPTIONS OF THE DRAWINGS

Figure 4A:
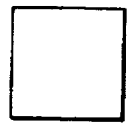

FIGS 4A and B show plan views of a lid with a solder preform attached on one surface.

Figure 5A:
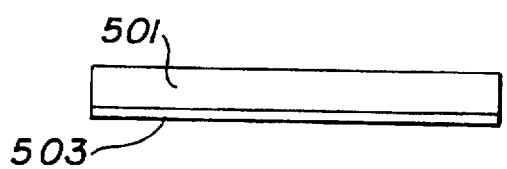

FIGS. 5A, B and C illustrate an enlarged view of the process of solder sealing a lid to a package substrate.

Figure 6:
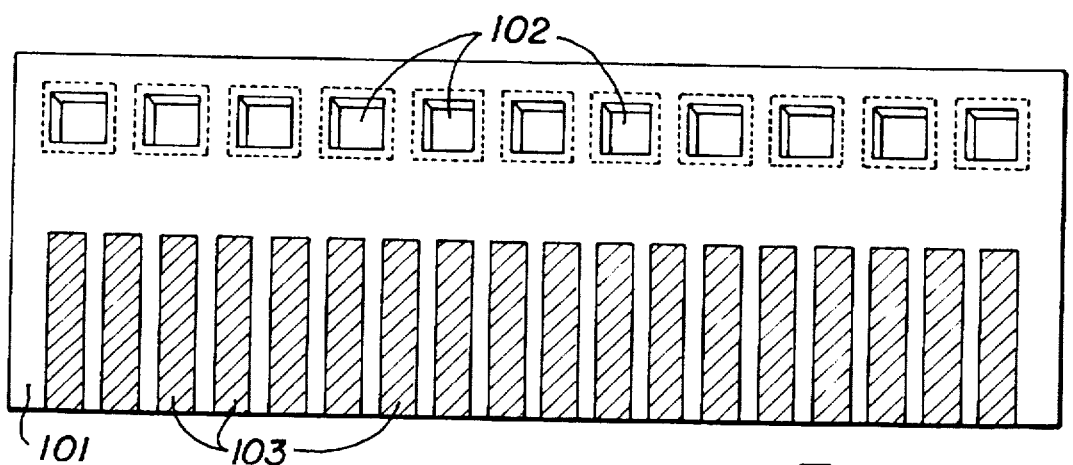

FIG. 6 illustrates a plan view of a package substrate constructed in accordance with the present invention.

Figure 7:
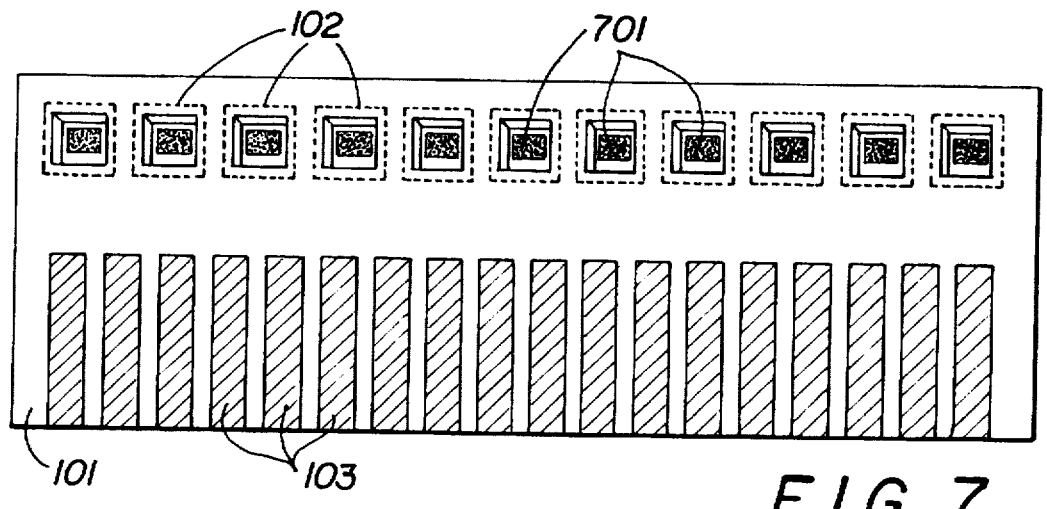

FIG. 7 illustrates semiconductor dice in package cavities arranged on a package substrate of the present invention.

Figure 8:
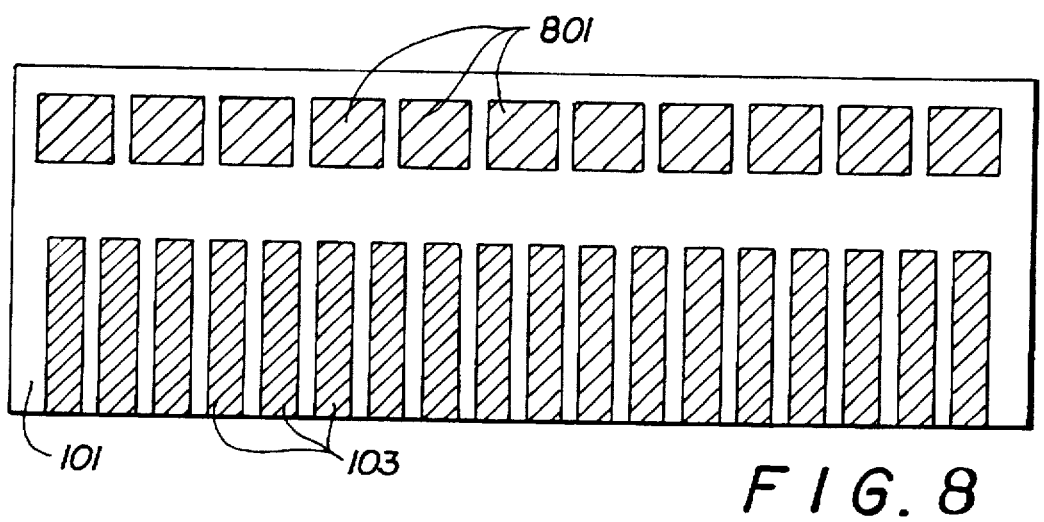

FIG. 8 shows a package substrate with lids placed on top and solder sealed.

Figure 9:
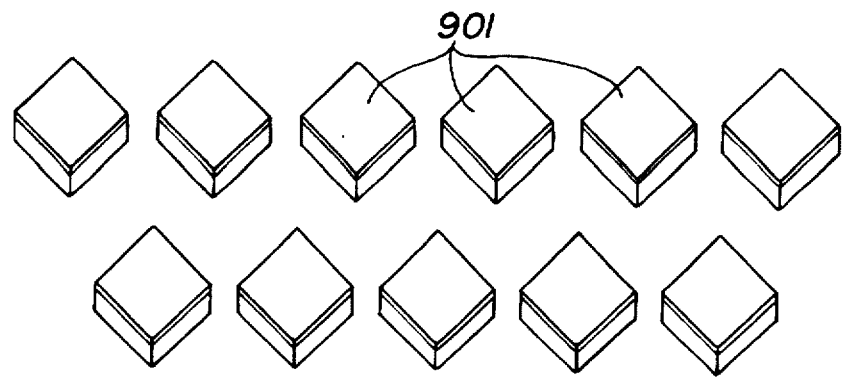

FIG. 9 shows packaged devices after separating from a substrate board.

DETAILED DESCRIPTION OF THE PRESENT INVENTION

The present invention is a method and apparatus for batch testing of surface mount semiconductor devices. In the following description, numerous specific details, such as number of devices, substrate type, etc., are set forth in detail in order to provide a more thorough description of the present invention. It will be apparent, however, to one skilled in the art, that the present invention may be practiced without these specific details. In other instances, well-known features have not been described in detail so as not to obscure the present invention.

The continuing trend of reducing the size of electronic devices has resulted in the development of increasing smaller semiconductor device packages, including small outline transistor (SOT) packages. These small packages are difficult and expensive to test and burn-in individually. The present invention provides a solution to these problems. The present invention uses a ceramic board that contains a plurality of packaged devices. The board includes interfaces to external equipment via an edge connector. The use of this type of board enables the parts to be tested in a batch mode and substantially reduces the cost of testing and burn-in.

By testing packaged devices in batch mode, the present invention avoids the disadvantages of prior art systems that test packaged devices individually.

The board can be comprised of one of a variety of standard packaging materials, e.g. ceramic packaging materials. A preferred embodiment of the invention uses an alumina type ceramic. The size of the board and the number of units tested per board may also vary. One embodiment of the invention comprises twelve packaging substrates per board, and is only limited by the number of pins available in edge connectors.

Figure 1:
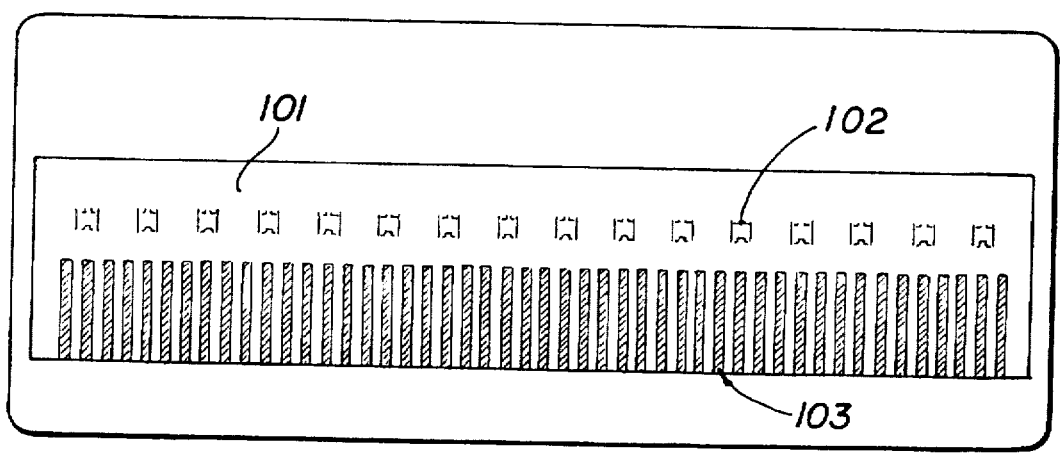
FIG. 1 is a schematic diagram of the preferred embodiment of the present invention.

The preferred embodiment of the present invention is illustrated in FIG. 1. The invention comprises a ceramic substrate 101 that includes device receiving areas and edge connector conductive strips 103. Conductive strips can be made in aluminum. The device receiving areas may be formed as recesses in the substrate. Alternatively, the device receiving areas may be planar, with a device lid (cover) defining a recess for receiving the part. The plurality of recessed areas 102 form package substrates. The size and shape of these package substrates is dependent upon the size of the integrated circuit die, or other electrical device, that they contain. The ceramic substrate and recessed areas are part of the final package of the device contained therein. This contrasts with prior art schemes where devices are packaged individually, instead of in batches as in the present invention.

Edge connector pads 103 are used to connect the board to external devices, for example, test and burn-in equipment.

The use of an edge connector allows a plurality of small package parts to be quickly and reliably connected to a large number of external resources. The use of fine pitch edge connectors enables over one hundred independent external resources to be connected. The number of independent connections can be further increased by using edge connectors on more than one side of the board.

Figure 2:
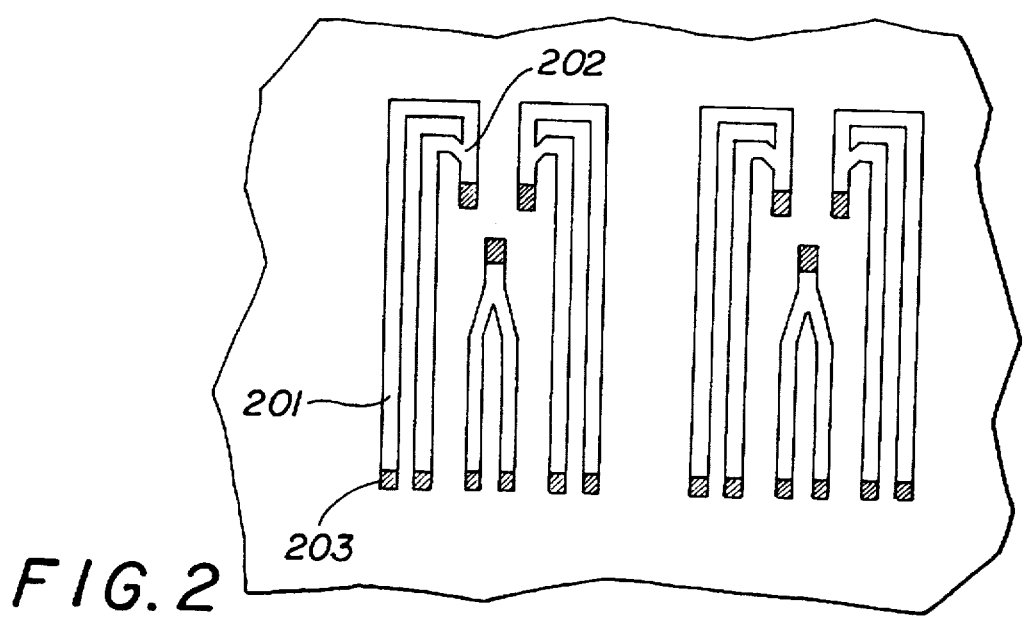
FIG. 2 is a detailed diagram of the conductor pattern of the embodiment of FIG. 1.

The ceramic board comprises a plurality of layers. FIG. 2 shows a part of a metal layer. At least one metal layer is used to form a plurality of traces 201 that connect the bonding pads 202 of the package substrates 102 to the vias 203 and ultimately to the edge connector pads 103. The metal layers are placed between ceramic insulating layers, as opposed to on either the upper or lower external surface of the board, to enable the external ceramic layers to be scribed without cutting the traces. This allows the board to be scribed before the parts are tested and burned-in.

One of the limitations in the number of edge connector pads that can be used is the typically five percent dimensional tolerance of a packaging ceramic, such as alumina. This limitation can be circumvented by silk screening on the pads after the ceramic has been fired. The silk screen pattern can be shaped so as to accommodate the required tolerance in the location of the vias 203 and provide the accuracy in the position of the edge connector pads 103 required by higher count edge connectors.

The large number of independent pin connections enables the board to e used for both the burn-in and functional testing of the devices. During burn-in testing many of the pins on the different devices can be connected in parallel, including power supply and ground pins. However, for functional testing of the devices most of the pins require separate connections to external resources as provided by the present invention through the use of edge connectors.

The use of edge connectors also enables separate (current) force and sense (voltage) traces to be made that are not connected until they are as close to the package substrate pad as possible, e.g. Kelvin connections. The proximity of the point where the force and sense lines are connected is critical because it determines the point where the voltage is measured, and any voltage drops between that point and the part are measured. Kelvin connections provide for more accurate measurements, and are particularly important where high currents are used or small voltages are being measured. As illustrated in FIG. 2, the point at which the force and sense lines are connected is substantially at the device bonding pad.

The following describes the principle steps in the process of making the present invention, as illustrated in FIGS 6 through 9. A ceramic substrate layer is formed. A metal layer is then formed with traces connecting the bonding pads of the package substrates to the edge connector pads. The metal layers are subjected to high temperatures when the board is fired; hence, a high temperature metal must be used for the traces. A preferred embodiment of the invention uses tungsten for the metal layer. A second ceramic layer is then placed on top of the metal layer. This process may then be repeated alternating metal trace layers with ceramic insulating layers to create a large number of traces. Connections between traces on different layers are made using vias as needed.

Edge connector pads are then created on at least one edge of both the top and substrate ceramic layers. Desired connection points, including the edge connector pads, are then electroplated with, for example, gold. A side bar is used to short all of the traces together during the electroplating process. The side bar is removed after the electroplating process is finished to isolate the traces. An example of a completed package substrate ready for assembly is shown in in FIG. 6. An array of cavities (recessed areas) 102 are arranged on package substrate 101.

Figure 3:
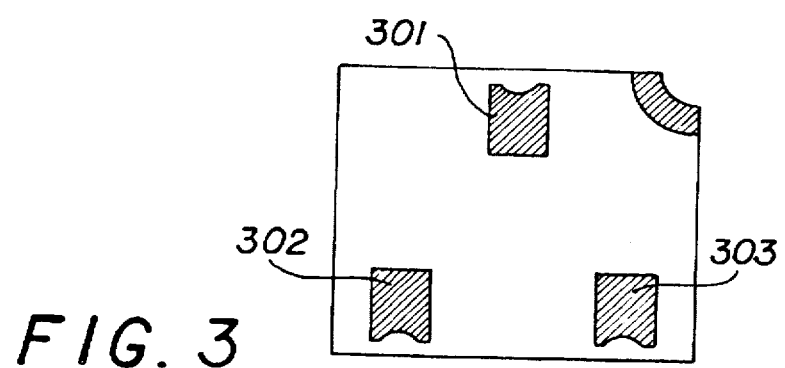
FIG. 3 illustrates the contact pads of the packaged device of the present invention.
Figure 4B:
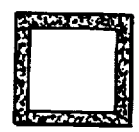
Figure 5B:
Figure 5C:
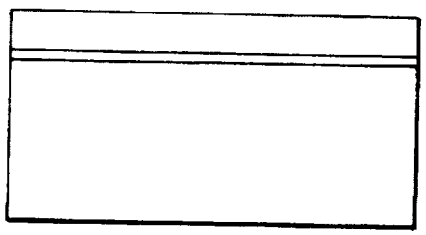

In one embodiment of the invention integrated circuit die is then attached to each of the package substrates. FIG. 7 shows semiconductor dice 701 placed inside package cavities 102 arranged on package substrate 101. Bond wires are then attached between each of the bonding pads on the die and the bond wire pads in the package substrate. Lids are then attached to the package substrates, using for example soldering (a solder seal). FIGS 4A and B show a lid with a solder preform attached on one surface of the lid. Solder preform is denoted as the shaded area as shown in FIG. 4B. Such a lid then can be attached to a package substrate with metalized surface to form a sealed package as illustrated in FIGS. 5A, B and C. In FIG. 5, lid 501 with solder preform 503 is placed upon the metalized surface of the package substrate and heated to cause the solder to melt and join the two surfaces together (solder sealing). As shown in FIG. 3, in one embodiment of the invention, packages are used with three surface mount contact pads, on the bottom surface of the package (301, 302, 303). The lid is on the top surface, and is not visible in this figure. FIG. 8 shows package substrate 101 with lids 801 placed on top and solder sealed. Sealed devices become an integral part of the package substrates. The package substrates therefore become an integral part of the final packages of the devices. In other embodiments, "flip-chip" assembly techniques are employed.

The board is then ready to be used in the process of testing the functionality of the devices, as well as in the burn-in process. After testing and burn-in is complete, the packaged parts may be separated from the board. FIG. 9 shows completed devices 901 in their individual packages after separating from a package substrate. The preferred embodiment of the invention uses scribe lines to enable the packages to be snapped out of the board. Other techniques may be used to remove the packages from the board including the use of perforations, or cutting the board using a saw or laser.

Thus a method and apparatus for batch testing surface mount devices using a substrate edge connector has been described.

I claim:

1. A method for manufacturing packaged semiconductor devices, the method comprising the steps of:

providing a substrate including a plurality of receiving areas, each receiving area including at least one bonding pad coupled to a portion of said substrate, said substrate adapted for electrical connection between each of the at least one bonding pad and a semiconductor device testing apparatus;

mounting a semiconductor device into each of said plurality of receiving areas;

coupling each of said semiconductor devices to each of said at least one bonding pad of said plurality of receiving areas;

sealing each of said semiconductor devices within said plurality of receiving areas to produce a plurality of individual packaged semiconductor devices integral to the substrate;

connecting said plurality of packaged semiconductor devices to said testing apparatus;

functional testing each of said plurality of packaged semiconductor devices; and separating the plurality of packaged semiconductor devices from a remainder of said substrate.

2. The method according to claim 1, wherein the sealing step further comprises the steps of:

providing a plurality of lids each sized greater than an opening to a corresponding one of said plurality of receiving areas;

applying solder preform to at least one side of each of said plurality of lids;

placing each of said plurality of lids over each of said plurality of receiving areas; and heating said solder preform to join said plurality of lids surrounding each opening of said plurality of receiving areas.

3. The method according to claim 1, wherein the testing step includes the step of connecting an edge connector of the substrate to said testing apparatus, the edge connector enables Kelvin connections to be used during testing.

4. The method according to claim 1, wherein the substrate further includes an edge connector providing the electrical connection with the semiconductor device testing apparatus and the plurality of packaged semiconductor devices.

5. A method for manufacturing packaged semiconductor devices, the method comprising the steps of:

providing a substrate including a plurality of receiving areas, each of the plurality of receiving areas including at least one bonding pad coupled to a portion of the substrate;

mounting a semiconductor device into each of the plurality of receiving areas;

coupling each of the semiconductor devices to the at least one bonding pad of each of the plurality of receiving areas;

sealing each of said semiconductor devices within said plurality of receiving areas to produce a plurality of individual, surface mount packaged semiconductor devices integral to the substrate;

functional testing each of said plurality of surface mount packaged semiconductor devices; and separating the plurality of packaged semiconductor devices from a remainder of said substrate, the remainder being the substrate between the plurality of packaged semiconductor devices.

6. The method according to claim 5, wherein prior to the testing step, the method further comprising the steps of:

providing a testing apparatus; and connecting an edge connector of said substrate to provide an electrical connection between each of the packaged semiconductor devices and the testing apparatus.

7. The method according to claim 6, wherein the testing step includes the step of using Kelvin connections to test each of the plurality of surface mount packaged semiconductor devices.

8. The method according to claim 5, wherein the sealing step further comprises the steps of:

providing a plurality of lids, each sized greater than an opening to a corresponding one of said plurality of receiving areas;

applying solder preform to each of said plurality of lids;

attaching each of said plurality of lids to cover each opening of said plurality of receiving areas; and heating said solder preform to produce the plurality of surface mount packaged semiconductor devices.

9. A method for manufacturing packaged semiconductor devices, the method comprising the steps of:

providing a substrate including a connector and a plurality of receiving areas, a first receiving area of the plural of receiving areas including a bonding pad;

coupling a semiconductor device to the bonding pad of the first receiving area;

enclosing the semiconductor device within the first receiving area to form a first packaged semiconductor device integral to the substrate;

functional testing the first packaged semiconductor device via the connector; and separating the first packaged semiconductor device from the substrate sustrate so that the first packaged semiconductor device is separate from a remainder of the substrate.

10. The method according to claim 9, wherein the coupling step includes the steps of placing the semiconductor device into the first receiving area; and connecting the semiconductor device to the bonding pad.

11. The method according to claim 9, wherein the enclosing step further comprises the steps of:

providing a lid sized greater than in opening to the first receiving area;

applying solder preform to one side of the lid;

placing the lid over the first receiving area to be in direct contact with the substrate; and heating the solder preform to join the lid to the substrate.

12. The method according to claim 9, wherein the testing step further includes the step of testing a second packaged semiconductor device generally concurrent with the testing of the first packaged semiconductor device.

13. The method according to claim 12, wherein prior to the testing step, the method further comprises the step of interconnecting the connector, being an edge connector, to a semiconductor device testing apparatus, the edge connector providing an electrical connection with the first and second packaged semiconductor devices and the semiconductor device testing apparatus.

14. The method according to claim 9, wherein the testing step includes the step of using Kelvin connections to test at least the first packaged semiconductor device.

15. A method for manufacturing packaged semiconductor devices, the method comprising the steps of:

providing a substrate including a plurality of receiving areas, each of the plurality of receiving areas including at least one bonding pad coupled to a portion of the substrate;

mounting a semiconductor device into at least two of the plurality of receiving areas;

coupling each of the semiconductor devices to the at least one bonding pad of each of the at least two receiving areas;

sealing each of said semiconductor devices within said at least two receiving areas to produce a plurality of individual, packaged semiconductor devices integral to the substrate;

testing said plurality of packaged semiconductor devices; and separating the plurality of packaged semiconductor devices from a remainder of said substrate, the remainder being the substrate between the plurality of packaged semiconductor devices.

16. The method according to claim 15, wherein prior to the testing step, the method further comprising the steps of:

providing a testing apparatus; and connecting an edge connector of said substrate to the testing apparatus, the edge connector providing an electrical connection with said plurality of packaged semiconductor devices and the testing apparatus.

17. A method for manufacturing packaged semiconductor devices, the method comprising the steps of providing a substrate including a plurality of receiving areas, each of the plurality of receiving areas including at least one bonding pad coupled to a portion of the substrate;

mounting a semiconductor device into each of the plurality of receiving areas;

coupling each of the semiconductor devices to the at least one bonding pad of each of the plurality of receiving areas;

sealing each of said semiconductor devices within said plurality of receiving areas to produce a plurality of packaged semiconductor devices integral to the substrate; and using Kelvin connections to test the plurality of packaged semiconductor devices.

18. The method according to claim 17 further comprising the steps of separating the plurality of packaged semiconductor devices from a remainder of said substrate, the remainder being the substrate between the plurality of packaged semiconductor devices.

* * * * *

UNITED STATES PATENT AND TRADEMARK OFFICE
CERTIFICATE OF CORRECTION

PATENT NO. : 5,798,652 Page 1 of 1
APPLICATION NO. : 08/688234
DATED : August 25, 1998
INVENTOR(S) : Taraci It is certified that error appears in the above-identified patent and that said Letters Patent is hereby corrected as shown below:

In Claim #9, Line #4, please delete "plural" and insert -- plurality --.

In Claim #11, Line #11, please delete "in" and insert -- an --.

Signed and Sealed this

Eighteenth Day of July, 2006

JON W. DUDAS
*Director of the United States Patent and Trademark Office*